United States Patent
Sebald et al.

(10) Patent No.: US 7,018,748 B2
(45) Date of Patent: Mar. 28, 2006

(54) PROCESS FOR PRODUCING HARD MASKS

(75) Inventors: Michael Sebald, Weisendorf (DE); Ernst-Christian Richter, Erlangen-Bruck (DE)

(73) Assignee: Infineon Technologies AG, Munich (DE)

( * ) Notice: Subject to any disclaimer, the term of this patent is extended or adjusted under 35 U.S.C. 154(b) by 270 days.

(21) Appl. No.: 10/425,233

(22) Filed: Apr. 29, 2003

(65) Prior Publication Data
US 2003/0203314 A1   Oct. 30, 2003

(30) Foreign Application Priority Data
Apr. 29, 2002   (DE) ................................ 102 19 122

(51) Int. Cl.
*G03C 5/00*   (2006.01)
*G03F 9/00*   (2006.01)

(52) U.S. Cl. .......................... 430/5; 430/312; 430/313; 430/314; 430/320; 430/322; 430/323; 430/324; 430/325; 430/326; 430/329

(58) Field of Classification Search .................... 430/5, 430/322, 323, 324, 312, 313, 314, 320, 325, 430/326, 329
See application file for complete search history.

(56) References Cited

U.S. PATENT DOCUMENTS

| 5,234,793 A | * | 8/1993 | Sebald et al. ................ 430/323 |
| 2002/0172898 A1 | * | 11/2002 | Forester ...................... 430/328 |

* cited by examiner

*Primary Examiner*—Christopher G. Young
(74) *Attorney, Agent, or Firm*—Laurence A. Greenberg; Werner H. Stemer; Ralph E. Locher

(57) ABSTRACT

In a process for producing hard masks, an initiator layer that contains an initiator component is applied to a substrate. Then, a photoresist is used to produce a pattern on the initiator layer, in the trenches of which pattern the initiator layer is uncovered. Then, a curable hard mask material is applied and selectively cured, so that only those sections of the hard mask material that adjoin the initiator layer are cured. Finally, uncured hard mask material is removed using a solvent, and at the same time the lands formed from the resist are also removed. The pattern obtained in this way can then be transferred to the substrate, for example using plasma.

16 Claims, 1 Drawing Sheet

PROCESS FOR PRODUCING HARD MASKS

BACKGROUND OF THE INVENTION

Field of the Invention

In the fabrication of microchips, semiconductor substrates are patterned using lithographic processes. For this purpose, a film of light-sensitive resist is applied to the substrate and the film is then exposed in sections. The exposure in sections can be effected by direct writing with an electron beam or as a result of a mask which includes the necessary information concerning the pattern to be formed being disposed in the beam path between the light source and the photoresist. Exposure using a photomask is generally carried out using short-wave, mono-chromatic light which is generated, for example, using a laser. Currently, industrial fabrication of microchips uses light with a wavelength down to as little as 193 nm. There is currently ongoing research aimed at adapting the lithographic processes to use even shorter wavelengths, in particular 157 nm. The exposure results in a chemical modification of the photoresist, with the result that selectively only the exposed or unexposed sections of the resist film become soluble in a developer. Then, in a developing step, the soluble sections of the resist film are removed and the substrate disposed beneath the resist film is uncovered. The insoluble sections of the resist form a resist pattern which protects the substrate disposed beneath the resist film from attack, for example from etching media. A distinction is drawn between positive photoresists, in which the exposed sections of the resist film are converted into a soluble form, and negative photoresists, in which the exposed regions are converted into an insoluble form, for example by cross-linking of the polymers contained in the resist and remain on the substrate as a patterned resist after the developing step. To prevent exposure errors resulting from reflection, an anti-reflection film that absorbs the incident radiation, for example by interference, is generally disposed beneath the photoresist film. The antireflection films are generally applied to the substrate by sputtering, requiring accurate control of the layer thickness of the antireflection film that is to be produced. After the resist film has been patterned, the anti-reflection film or the substrate in the trenches of the resist pattern is uncovered and can be removed using an etching medium. The etching operation therefore transfers the pattern that has been predetermined by the patterned resist to the substrate. By way of example, wet-chemical processes can be used for this purpose. Particularly in the case of patterns with very small dimensions or patterns that are etched very deeply into the substrate, such as for example trenches for deep trench capacitors, however, plasma is generally used for the etching. The plasma may have a preferential direction, with the result that the substrate can be etched anisotropically. This also allows the pattern which is predetermined by the patterned resist to be transferred to the substrate to scale, making it possible to produce trenches with a depth of up to 50 μm. Relatively long etching times are required to produce patterns of this type. Therefore, the patterned resist must have a sufficient etching resistance to ensure that it still has a sufficient layer thickness for the pattern to be transferred to the substrate without defects even toward the end of the etching operation. However, this presents considerable difficulties. To allow accurate reproduction of the pattern to be produced in the photoresist film, the latter is configured to be very thin, in order to ensure sufficient depth of focus. Therefore, the pattern produced from the resist film likewise has a low layer thickness. Therefore, the pattern produced from the photoresist is generally not sufficiently able to withstand etching plasma. Furthermore, the photoresists generally contain organic polymers as their main component. In an oxygen plasma, the polymers can easily be oxidized to form carbon dioxide and water. Therefore, the mask would be worn away very quickly, and consequently the pattern cannot successfully be transferred to the substrate. To overcome these difficulties, the mask produced from the photoresist is used to produce a mask made from a material which has a high stability with respect to the plasma used to etch the substrate. For this purpose, a layer of a hard-mask material is applied to the substrate that is to be etched. The thickness of the layer is selected to be relatively great in order to ensure sufficient stability of the hard-mask material with respect to the etching plasma while the substrate is being etched. An antireflection layer is applied to the hard-mask layer, for example by sputtering. Finally, a layer of a photoresist is applied to the antireflection layer. Then, as described above, the photoresist film is exposed and developed, so that a patterned resist is obtained. Once again, the antireflection layer is uncovered in the trenches of the patterned resist. Then, the antireflection layer is removed in the trenches using plasma, and subsequently the pattern is transferred to the hard mask layer using suitable etching plasma. Finally, the patterned resist is removed, for example by being dissolved in a solvent. A pattern containing a hard mask material which, compared to the etching resistance of the photoresist film, has a considerably higher stability with respect to the plasma used to etch the substrate, is then present on the substrate. Next, the substrate material that is uncovered in the trenches is removed using suitable etching plasma, and in this way the pattern that has been predetermined by the hard mask is transferred to the substrate. Finally, the hard mask is removed, for example using suitable plasma or by being dissolved using a suitable solvent.

The plasma steps required in order to deposit and pattern the layer of the hard mask material makes the use of a hard mask of this type time-consuming and expensive. However, the fabrication of microchips is subject to high pressure on costs, since a considerable price drop starts relatively quickly after a new micro-chip has been introduced to the market. Therefore, there is a constant demand for further development of the fabrication processes in order to simplify the fabrication of microchips and therefore allow this process to be carried out at lower cost.

SUMMARY OF THE INVENTION

It is accordingly an object of the invention to provide a process for producing hard masks that overcomes the above-mentioned disadvantages of the prior art methods of this general type, which is simple and inexpensive to carry out.

With the foregoing and other objects in view there is provided, in accordance with the invention, a process for producing patterned hard masks. The process includes providing a substrate, applying an initiator component to the substrate resulting in an initiator layer being formed, applying a resist to the initiator layer, and patterning the resist resulting in a patterned resist with lands and trenches disposed between the lands. The initiator layer is uncovered in the trenches. A hard mask material is applied to the patterned resist resulting in a hard mask component being in contact with the initiator layer in the trenches. The parts of the hard mask component that are in contact with the initiator layer in the trenches are selectively cured. Then, uncured hard mask material is removed. Finally, the patterned resist is removed resulting in a hard mark in which positions of the lands of the patterned resist now removed correspond to positions of newly formed trenches.

In the process according to the invention, the hard mask is produced by a chemical reaction from the hard mask material that is cured in the trenches that are predetermined by the patterned resist. The hard mask material must be curable, i.e. it must be possible for the material to be converted in a targeted fashion into a form that has a high etching resistance with respect to plasma. Therefore, the initiator layer used is a layer of an initiator component that can effect curing of the hard-mask material. The curing operation commences in those sections of the hard mask material that directly adjoin the initiator layer and then proceeds into those regions of the hard mask material which are disposed further away from the initiator surface. As a result, the curing of the hard mask material can be controlled in such a way that the hard mask material is selectively cured only in the trenches of the patterned resist. The curing of the hard mask material can be controlled, for example, by the duration of the curing of the hard mask material. However, it is also possible to influence the rate of curing, for example by matching the level of the initiator component in the initiator layer to the reaction time within which curing of the hard-mask material is to take place. Furthermore, curing of the hard mask material can also be controlled, for example, by temperature. For this purpose, the substrate, generally a silicon wafer, can, for example, be placed onto a hotplate and heated from the back surface of the substrate.

Since the hard mask in the trenches of the patterned resist is produced directly by chemical curing, there is no need for the deposition and etching steps that are required in the processes carried out hitherto and in which the pattern that is predetermined by the patterned resist is transferred to the hard mask layer. Therefore, compared to the processes which have hitherto been customary for production of a hard mask, the process according to the invention contains fewer working steps and does not require expensive and complex plasma deposition and etching of the hard mask material in plasma. As a result, the process according to the invention can be carried out using significantly simpler equipment, which brings cost advantages.

In the process according to the invention, first of all a substrate is provided. The substrate may per se be of any desired configuration. A silicon wafer, in which microelectronic components may already be integrated, is generally used as the substrate. However, it is also possible to use substrates made from other materials, for example glass or polymer materials. The initiator component is applied to the substrate. The initiator component is selected according to the hard mask material and must be able to initiate curing of the hard mask material. The initiator component is preferably applied in solution. In this context, it is possible to use standard processes, for example dip processes or spray processes. It is particularly preferable for the solution of the initiator component to be spun onto the substrate, since this makes it possible to achieve a uniform layer thickness of the initiator layer with a defined layer thickness. However, the initiator component may also be applied in solvent-free form, for example by vapor deposition. If the initiator component is applied in the form of a solution, the solvent is evaporated after application. For this purpose, the substrate can be heated briefly in order on the one hand to completely evaporate the solvent and on the other hand to ensure a uniform layer quality of the initiator layer. The temperature is selected in such a way that, first, the solvent is expelled as completely as possible from the initiator layer and, second, the initiator component is not thermally decomposed. Then, a resist is applied to the initiator layer. The resist is preferably likewise applied as a solution, it being possible, for example, to use the processes listed above. The resist used is preferably a photosensitive resist as is customary for the patterning of semiconductors and supplied, for example, by commercial manufacturers. It is possible to use both negative photoresists and positive photoresists. It is preferable to use positive photoresists. It is particularly preferable to use chemically amplified photoresists, since these are highly light-sensitive and therefore allow shorter exposure times. If the resist is applied in solution, the substrate is then heated in order for the solvent to be evaporated as completely as possible and to obtain a uniform layer quality of the resist film. The solvent of the resist is selected in such a way that the dissolution of the initiator layer is minimized and there is no mixing of the initiator layer and the resist layer.

The resist film is then patterned in the usual way. For this purpose, the resist is first of all exposed in sections, for which purpose, by way of example, a photomask which contains the information about the pattern to be formed is disposed in the beam path between light source and resist film. The exposed resist is then conditioned in the usual way and then developed with a developer, so that selectively either the exposed sections (in the case of positive resists) or the unexposed regions (in the case of negative resists) are removed. There are then raised regions of the material of the resist, which are referred to below as lands, present on the substrate surface. Between the lands there are trenches in which the initiator layer is uncovered.

A hard mask material is then applied to the patterned resist. The hard mask material is preferably likewise applied in solution, it being possible to use the processes described above. It is preferable for the hard mask material to be spun onto the surface of the substrate in the form of a solution. In this way, the trenches of the patterned resist are filled with the hard mask material. If the hard mask material is spun on as a solution, the conditions are preferably selected in such a way that the minimum possible amount of excess hard mask material remains on the surface of the substrate.

In the trenches of the patterned resist, the hard mask material is now in contact with the initiator component, with the result that the hard mask material can be selectively cured in the trenches. After the selective curing of the hard mask material, uncured parts of the hard mask material are removed by, for example, being dissolved using a solvent. Finally, the material of the patterned resist is removed, so that a hard mask in which the lands of the patterned resist form trenches is obtained. The hard mask obtained therefore forms a negative image of the patterned resist. The patterned resist is preferably removed using a solvent, the removal of the uncured hard mask material and of the material of the patterned resist preferably being carried out in a single step. However, it is also possible for the material of the patterned resist to be removed using other processes, for example with the aid of oxygen plasma. If the cured hard mask material remains on the top side of the patterned resist, it can be removed before the material of the patterned resist is dissolved, for example by a mechanical step, such as grinding or polishing.

The hard mask obtained can directly form a component of the microchip that is to be fabricated and may act, for example, as a dielectric disposed between interconnects. For this purpose, the trenches of the hard mask are filled with a conductive material, for example polysilicon or preferably copper. However, the hard mask may also be used as mask for patterning the substrate disposed beneath the hard mask. In this embodiment, the pattern that has been predetermined by the trenches of the hard mask is transferred to the substrate. A suitable plasma is preferably used for this purpose.

As has already been mentioned in the introduction, an antireflection layer, which is intended to prevent reflection in the photoresist, is generally disposed beneath the photoresist film. Otherwise, the reflections can lead to incorrect reproduction of the pattern to be produced. For this purpose, in conventional processes a separate antireflection layer has been applied and has to be removed again in the sections that are uncovered in the trenches after patterning of the photoresist film by wet-chemical processes or in a plasma-etching step. In a particularly preferred embodiment of the process according to the invention, the initiator layer is formed as an antireflection layer. This can be achieved, for example, by the layer thickness of the initiator layer being selected appropriately or by corresponding absorbent substances being added to the initiator layer. The initiator layer can then be dissolved together with the lands of the patterned resist disposed thereon, so that in this respect too it is possible to simplify the process compared to the processes that are known from the prior art.

The initiator component may form the initiator layer in bulk. However, it may also be advantageous for the initiator component to be fixed in a matrix. In this way, for example, the initiator component can be fixed to the substrate more easily, or the physical properties, for example the antireflection properties, of the initiator layer may be modified by the material of the matrix. For this purpose, the initiator layer is formed by a polymer matrix that contains the initiator component. The initiator component can then, for example, diffuse out of the initiator layer into the hard mask material, or else the initiator component may be activated by external supply of energy, for example by heating or exposure, and can then initiate curing of the hard mask material at the surface of the initiator layer.

The initiator component is selected as a function of the hard mask material and must be able to initiate curing the hard mask material. Therefore, the initiator component can be configured in numerous ways. For example, the initiator component may be an acid or a base and may, for example, bring about anionic or cationic polymerization of the hard mask material. However, the initiator component may also be a free radical initiator that is activated, for example, by irradiation or heating and initiates free radical polymerization of the hard mask material. It is also possible for the initiator component to be configured as oxidizing agents or as reducing agents which initiate curing of the hard mask material, for example in an anionic or cationic polymerization.

The initiator component is preferably initially present in an inert form in the initiator layer and is only converted into an active form by external supply of energy. This enables the procedure to be significantly simplified. According to a preferred embodiment, for this purpose the initiator component is formed as a photoactivatable compound. After the resist has been patterned, the substrate can then be exposed with a suitable wavelength in order, for example, to release acids or bases or to produce free radicals. According to a further preferred embodiment, the initiator component is formed as a thermally activatable compound. To cure the hard mask material, the substrate is heated after the hard mask material has been applied, for example by being placed onto a hotplate. The photo-activatable compounds or thermally activatable compounds used may be standard compounds as are known, for example, from the processing of photoresists. The initiator component is selected in a suitable way such that it can be selectively activated, i.e., by way of example, is not released in the working steps carried out previously.

A further possible way of curing the hard mask material consists in providing a material for electroless deposition as the initiator component. For this purpose, the initiator layer contains suitable nuclei. This embodiment of the process according to the invention is particularly suitable if the hard mask is composed of a metallic material. The nuclei that are present in the initiator layer are dissolved during the deposition of the metal structures. The initiator layer may, for example, be formed by the top layer of a semiconductor substrate into which a doping has been introduced as nuclei.

In a further embodiment of the process according to the invention, the initiator layer is formed as a current-conducting layer. In this case, the current-conducting layer may either be deposited on the substrate as a separate layer or the conductivity of the substrate may be increased at the surface by suitable doping, in order in this way to form a current-conducting layer. The semiconductor material is then deposited on the surface of the initiator layer in an electrodeposition process, the material being selectively deposited only in the uncovered sections of the initiator layer. This embodiment of the process according to the invention is likewise particularly suitable for the production of hard masks from metallic materials.

The hard-mask material used may per se be any material that can be converted by an initiator component into a material which has a high etching resistance with respect to the plasma used to etch the substrate. According to a preferred embodiment of the process according to the invention, the hard mask material contains polymerizable monomers or oligomers. The initiator component can then bring about polymerization, as a result of which the hard mask material is converted into an insoluble form that adheres to the substrate or the initiator layer. By way of example, monomeric or oligomeric unsaturated hydrocarbons that include a high proportion of silicon-containing groups are suitable. However, it is also possible to use other monomeric or oligomeric compounds that have the required properties.

According to a further preferred embodiment, the hard mask material contains a polymeric precursor compound. The polymeric precursor compound may, for example, have a different polarity than the cured hard-mask material. The polymeric precursor compound can then initially be dissolved in a suitable solvent and applied to the patterned resist or in the trenches formed thereby. After the solvent has been evaporated, the polymeric precursor compound can be converted, by use of a catalyst that acts as an initiator component, into a polymer that has a different polarity and is no longer soluble in the solvent used to apply the polymeric precursor compound. This can be achieved, for example, by a cyclizing reaction in which a poly-o-hydroxyamide is converted into a corresponding carbazole. After controlled, selective curing of the polymeric precursor compound, excess material can be dissolved again using the solvent used previously, with only the cured sections of the polymer remaining on the substrate.

As has already been mentioned, the hard mask may also consist of a metallic material that is produced, for example, by an electrodeposition process. For this purpose, the hard mask material contains a metal salt or an organometal compound. The metal salt can then be reduced to form the metallic material. Depending on the oxidation state of the organometal compound, the curing likewise takes place by reduction or, if the metal is already in oxidation state 0, by decomposition of the organometal compound.

According to a further embodiment, the hard-mask material contains surface-activated metallic, semi-metallic or nonmetallic nanoparticles. In this context, surface-activated nanoparticles are understood as meaning nanoparticles which, on their surface, bear functional groups which have a solubilizing action, or which contain a reactive group which, for example, can react with a further group in order in this way to link the nanoparticles. Examples of suitable groups are hydroxyl, carboxyl, amino or thiol groups or polymerizable double bonds. These groups may be contained in suitable molecules that have a further group by which they are bonded to the surface of the nanoparticle. For this purpose, the nanoparticle is converted into a reactive form by, for example, being chlorinated at the surface and is then reacted with the compound which is to be bonded. The compound which contains the functional group can then be fixed to the surface of the nanoparticle, for example by a hydroxyl group or an amino group, with chloride being released. The nanoparticles can then be precipitated or polymerized by the initiator component and in this way form a hard mask. In this case, the nanoparticles may also be bonded into a polymer matrix as a result of the hard mask material containing, for example, corresponding polymerizable monomers.

The patternable resist that is used to produce the trenches in which the initiator component is uncovered is not per se subject to any particular restrictions. It is possible to use commercially available photo-resists. According to a preferred embodiment, the resist is a photosensitive negative resist. The exposed regions then form trenches in the hard mask produced using the process according to the invention.

However, it is also possible for the resist used to be a photosensitive positive resist. In this case, the hard mask forms a negative pattern, i.e. the exposed regions of the photoresist correspond to lands in the hard mask. This embodiment is particularly preferred, since there is considerable experience with positive photoresists, in particular including for industrial applications.

Other features which are considered as characteristic for the invention are set forth in the appended claims.

Although the invention is illustrated and described herein as embodied in a process for producing hard masks, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
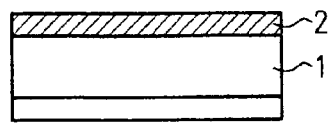
FIGS. 1A–1F are diagrammatic, sectional views showing working steps that are carried out in processes that are known from the prior art.
Figure 1B:
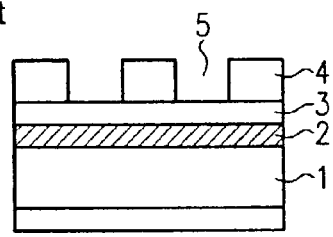
Figure 1C:
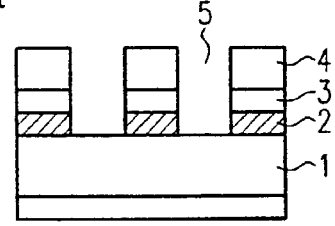
Figure 1D:
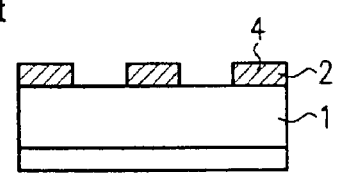
Figure 1E:
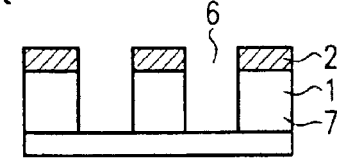
Figure 1F:
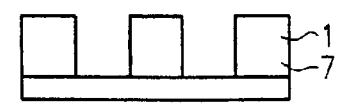

Referring now to the figures of the drawing in detail and first, particularly, to FIGS. 1A–1F thereof, there is shown a substrate 1 which is to be patterned and is composed, for example, of $SiO_2$. On the substrate 1 there is a hard mask 2 that, by way of example, has been applied to the substrate 1 which is to be patterned by plasma chemical vapor deposition (CVD). A hard mask material may, for example, is formed of polysilicon. Then, an antireflection layer 3 is applied to a surface of the hard mask layer 2, for example by a solution of a material which forms the antireflection layer 3 being spun onto the hard mask layer 2. The solvent is removed by brief heating, so that a solid antireflection layer 3 is obtained. Then, a photoresist film is spun on and the solvent is removed from the photoresist by further heating. The photoresist film is then exposed and developed, the exposed or unexposed regions being removed depending on the photoresist used (positive or negative photoresist). As illustrated in FIG. 1B, the result is lands 4 between which there are trenches 5. In a plasma-etching step, the antireflection layer 3 that has been uncovered at the base of the trenches 5 and then the hard mask layer 2 are removed. Depending on the materials used, this may also require the plasma system to be changed. The result is the configuration illustrated in FIG. 1C. On the substrate 1 there are lands 4, the top section of which is composed of the photoresist material, beneath which are disposed a layer containing the antireflection layer 3 and the hard mask layer 2. The substrate 1 is now uncovered in the trenches 5. The resist material of the lands 4 and the antireflection layer 3 are then removed by these materials being dissolved, for example, by a suitable solvent. As illustrated in FIG. 1D, only those sections of the lands 4 which are formed by the hard mask layer 2 remain on the substrate 1, forming a hard mask on the substrate 1. The unprotected sections of the substrate 1 are then etched anisotropically using a suitable plasma, resulting in the formation of trenches 6 which are delimited on both sides by lands 7 which in their upper section are formed by the material of the hard mask layer 2 and in their lower section are formed by the material of the substrate 1. Finally, the hard mask material 2 is removed, for example by a wet-chemical process or by using suitable plasma, so that the configuration illustrated in FIG. 1F is obtained. The dimensions of the lands 7 containing the substrate material 1 correspond to the resist lands 4, the dimensions of which were defined by exposure. The pattern defined by the exposure of the photoresist has therefore been transferred directly to the substrate layer 1.

Figure 2A:
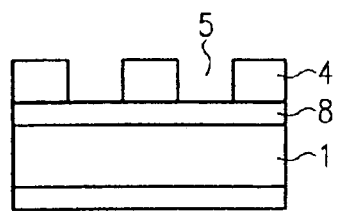
FIGS. 2A–2E are diagrammatic, sectional views showing working steps that are carried out in the process according to the invention.
Figure 2B:
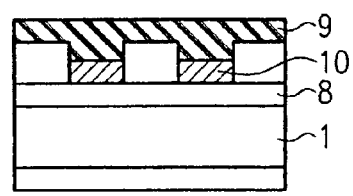
Figure 2C:
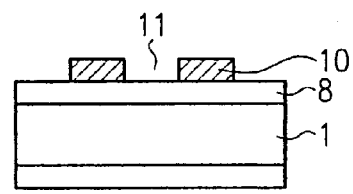
Figure 2D:
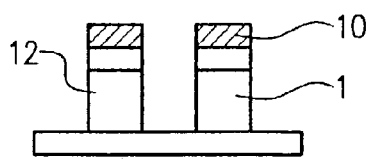

FIGS. 2A–2E show the sequence involved in carrying out the process according to the invention. First, an initiator layer 8 is applied to the substrate 1. For this purpose, by way of example, a solution of an initiator component is applied to the substrate 1 by being spun on. The substrate 1 is heated briefly, for example on a hotplate, in order to evaporate the solvent and to anneal any irregularities present in the initiator layer 8. Then, a photoresist is applied to the initiator layer 8 and is patterned as described in FIG. 1B, so that the lands 4 and the trenches 5 are obtained. The initiator layer 8 is uncovered in the trenches 5. Then, a hard-mask material 9 is applied to the patterned surface illustrated in FIG. 2A, for example by a solution of the hard mask material being spun on, see FIG. 2B. In the trenches 5, the hard mask material 9 is in contact with the initiator layer 8, so that the initiator component contained in the initiator layer 8 can initiate curing of the hard mask material 9. By selecting the reaction conditions, such as reaction temperature, reaction time or concentration of the initiator component in the initiator layer 8, the curing is controlled in such a way that only a section 10 of the hard mask material 9 is cured. Excess, uncured hard mask material 9 is then washed off using a solvent, the lands 4 of the resist being removed at the same time. As illustrated in FIG. 2C, only sections 10 of the cured hard mask material 9 then remain on the surface of the initiator layer 8 and of the substrate 1. Material of the initiator layer 8 and/or of the substrate 1 which is uncovered in trenches 11 disposed between the sections 10 can then be removed by anisotropic etching using plasma, resulting in the formation of lands 12, see FIG. 2D. An upper section of the lands 12 is formed by the cured hard-mask material 10 and the lower section of which is substantially formed by the material of the substrate 1.

Figure 2E:
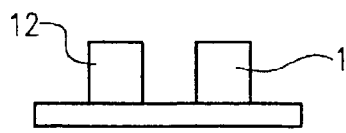

Finally, the sections 10 of the cured hard mask material 9 and if appropriate sections of the initiator layer 8 are removed, for example by etching with a plasma or by wet-chemical processes, so that the configuration illustrated in FIG. 2E is obtained. The lands 12 now are formed of the material of the substrate 1 and form a negative image of the pattern that was predetermined by the lands 4. The trenches 5 illustrated in FIG. 2A correspond to the lands 12 in FIG. 2E. In this way, a negative image 12 is formed from the pattern 4 produced using a positive photoresist.

EXAMPLE

As with conventional antireflection layers, an initiator layer is produced on a substrate from solution in a suitable solvent, for example PGNEA, butyl lactate, cylcohexanone, etc., by being spun on followed by a thermal drying step which is carried out, for example, at temperatures of 70 to 280° C. for a duration of 40 to 300 seconds. The layer thickness set in the process is set according to the optimum antireflection action. Examples of suitable layer thicknesses are thicknesses in the range from 10 to 200 nm. Then, a photoresist is spun on and dried under conditions (temperature/time) recommended by the manufacturer. The precise conditions used to dry the resist are selected according to the optimum imaging properties of the photoresist. Suitable temperatures are in the range from 90 to 150° C. The drying time is selected appropriately in the range from 30 to 120 s. The layer thickness of the photoresist is selected according to the depth of focus provided by the lithography process and the required thickness of the hard mask, the resist layer thickness at least corresponding to the thickness of the hard mask that is to be produced. Typical resist layer thicknesses are in the range from 50 to 2,000 nm. Depending on the lithography process, the resist is exposed using visible light ($\lambda$=436 nm), near UV light ($\lambda$=365 nm), deep ultraviolet light ($\lambda$=248 nm or 193 nm), far ultra-violet light ($\lambda$=157 nm or 126), EUV light ($\lambda$=13 nm), X-rays, electron beam or ion beams through a mask or by direct writing, is if appropriate subjected to a temperature step and is finally developed in a suitable medium using the puddle, spray or dip process. Depending on whether a positive or negative photoresist is used, the exposed or unexposed regions of the resist are removed and relief structures are obtained in the resist layer. In the resist trenches, the initiator layer has been uncovered, while the resist lands cover the initiator layer. After developing and rinsing, a temperature step may optionally be used, ensuring final drying of the substrate and—depending on the chemical action of the initiator layer—activation of the initiator layer. By way of example, a temperature step in the range from 90 to 200° C./30–120 s on the hotplate is used. The process steps described thus far correspond to the known standard lithography processes.

Then, a solution of the hard-mask material is spun onto the patterned photoresist. It is also possible to use other processes, for example spray or dip processes or treatment from the vapor phase. After the material has been spun on, the substrate with the solution of the hard mask material on it is left to stand for example for 10 to 180 s (preferably 40 to 120 s) at room temperature. However, depending on the combination of initiator layer and hard mask material used, it may also be necessary for the spinning-on step to be followed by a temperature step on a hotplate, for example in the range from 80 to 200° C. for a time of 10 to 180 s. During the reaction time, the hard mask material or the gaseous agent reacts with the initiator component that is present in the initiator layer, resulting in controlled layer deposition. Finally, further rinsing is carried out with a solvent and the substrate is then dried. In the process, the solvent used for the rinsing and the process conditions are preferably selected in such a way that, during the rinsing, not only the surplus, uncured hard mask material layer is removed, but also, at the same time, the resist patterns are removed. The hard mask produced in this way is transferred to the substrate below using conventional plasma etching processes, firstly involving etching of the initiator layer, for example in an oxygen-containing plasma, followed by the etching of the substrate. By suitable selection of agents for the hard mask material, it is possible to achieve a very high etching selectivity for the etching of the substrate, which hitherto it was only possible to achieve using the previously known hard mask technique. The essential advantage of the process according to the invention lies in the simple procedure, which makes it possible to omit the expensive individual process steps of depositing the hard mask layer and etching the hard mask layer that have hitherto been required.

We claim:

1. A process for producing patterned hard masks, which comprises the steps of:
    providing a substrate;
    applying an initiator component to the substrate resulting in an initiator layer being formed;
    applying a resist to the initiator layer;
    patterning the resist resulting in a patterned resist with lands and trenches disposed between the lands, the initiator layer being uncovered in the trenches;
    applying a hard mask material to the patterned resist resulting in a hard mask component being in contact with the initiator layer in the trenches;
    selectively curing parts of the hard mask component which are in contact with the initiator layer in the trenches;
    removing uncured hard mask material; and
    removing the patterned resist resulting in a hard mask in which positions of the lands of the patterned resist now removed correspond to newly formed trenches.

2. The process according to claim 1, which further comprises transferring a pattern which is present as a result of the newly formed trenches in the hard mask, to the substrate.

3. The process according to claim 1, which further comprises applying the hard mask material to the patterned resist in solution.

4. The process according to claim 1, which further comprises forming the initiator layer as an anti-reflection layer.

5. The process according to claim 1, which further comprises forming the initiator layer from a polymer matrix that contains the initiator component.

6. The process according to claim 1, which further comprises selecting the initiator component from the group consisting of an acid, a base, a free radical initiator, an oxidizing agent and a reducing agent.

7. The process according to claim 1, which further comprises forming the initiator component as a photoactivatable compound.

8. The process according to claim 1, which further comprises forming the initiator component as a thermally activatable compound.

9. The process according to claim 1, which further comprises forming the initiator component with nuclei for electroless deposition.

10. The process according to claim 1, which further comprises forming the initiator layer as a current-conducting layer.

11. The process according to claim 1, which further comprises forming the hard mask material from a material selected from the group consisting of polymerizable monomers and oligomers, and at least one of the polymerizable monomers and the oligomers are polymerized in order to be cured.

12. The process according to claim 1, which further comprises forming the hard mask material to contain a polymeric precursor compound which is soluble in a given solvent, and the polymeric precursor compound is converted into a polymer which is no longer soluble in the given solvent in order to be cured.

13. The process according to claim 1, which further comprises forming the hard mask material to contain a material selected from the group consisting of metal salts and organometal compounds.

14. The process according to claim 1, which further comprises forming the hard mask material to contain one of surface-activated metallic nanoparticles, semimetallic nanoparticles, and non-metallic nanoparticles.

15. The process according to claim 1, which further comprises using a photosensitive negative resist as the resist.

16. The process according to claim 1, which further comprises using a photosensitive positive resist as the resist.

* * * * *